(12) United States Patent
Honda et al.

(10) Patent No.: US 7,012,452 B2
(45) Date of Patent: Mar. 14, 2006

(54) HIGH VOLTAGE HIGH SPEED AMPLIFIER USING FLOATING HIGH SIDE STRUCTURE

(75) Inventors: Jun Honda, El Segundo, CA (US); Jong-Deog Jeong, Rancho Palos Verdes, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/920,114

(22) Filed: Aug. 17, 2004

(65) Prior Publication Data

US 2005/0077928 A1  Apr. 14, 2005

Related U.S. Application Data

(60) Provisional application No. 60/496,263, filed on Aug. 19, 2003.

(51) Int. Cl.
*H03B 1/00* (2006.01)
(52) U.S. Cl. ........................... 327/108; 327/112
(58) Field of Classification Search ........ 327/108–112, 327/310, 333, 427, 434, 447; 326/82, 83, 326/26, 27, 80, 81; 330/149, 258
See application file for complete search history.

(56) References Cited

U.S. PATENT DOCUMENTS 5,933,034 A * 8/1999 Hastings et al. ............ 327/108
6,211,706 B1 * 4/2001 Choi et al. .................. 327/108

* cited by examiner

*Primary Examiner*—Long Nguyen
(74) *Attorney, Agent, or Firm*—Ostrolenk, Faber, Gerb & Soffen, LLP

(57) ABSTRACT

An integrated high-voltage linear amplifier IC with reduced power dissipation, faster operation, and small die size, comprising a low side well and a floating high side well; an error amplifier for receiving a noise signal; a level shifting circuit in the low side well for outputting a current mode error signal based on the noise signal to the high side well in differential current mode for noise reduction; and a drive circuit in the high side well. A voltage/current converter receives a voltage mode error signal based on the noise signal and supplies the current input signal. Current mirror circuitry and the drive circuit in the high side well outputs a sum current derived from the current mode error signal for driving external power devices.

7 Claims, 4 Drawing Sheets

HIGH VOLTAGE HIGH SPEED AMPLIFIER USING FLOATING HIGH SIDE STRUCTURE

CROSS-REFERENCE TO RELATED APPLICATION

This application is based upon and claims priority of U.S. Provisional Patent Application Ser. No. 60/496,263 filed by Jun Honda and Jong-Deog Jeong on Aug. 19, 2003 (IR-2567 PROV). This application is related to U.S. Ser. No. 10/860,755, titled ACTIVE EMI FILTER HAVING NO INDUCTIVE CURRENT SENSING DEVICE, filed by Jun Honda on Jun. 2, 2004 (IR-2483), the disclosures of which are incorporated by reference.

BACKGROUND OF THE INVENTION

1. Field of the Invention

The invention relates to a high speed, high voltage linear amplifier which can be built with IC technology, having two low voltage circuits in a silicon die which float with respect to each other. The IC structure can advantageously be used as the gate driver IC for a motor inverter circuit.

The invention relates more particularly to a gate driver IC which includes a CT-less active EMI filter for noise reduction in high voltage and high speed applications.

2. Related Art

FIGS. 1A and 1B are a schematic diagram showing a discrete implementation of an active filter for EMI reduction. A feature of the active filter is that it does not require an inductive current sensing device such as a current transformer (CT).

The active filter has a voltage input instead of a current sensing device to capture the common mode noise current to be canceled. Instead of current sensing as in earlier designs, an error amplifier senses the voltage difference between one of the AC lines and ground. The amplifier has a certain amount of impedance, which induces a voltage due to the noise current. The error amplifier creates a canceling current by amplifying the voltage difference between the line and ground. The canceling current is supplied to the ground line to compensate for the common mode noise current.

The error amplifier 10 is referenced to one of the AC line potentials via the REF and COM terminals, namely to the NEUTRAL line in this embodiment. Therefore, the noise voltage sensing can be done via a Y-capacitor C17 connected to ground and to a terminal VFB.

The common node noise current Icomnoise is generated by motor windings and driver circuitry. The amplifier 10 amplifies the noise voltage with negative polarity. The injection current is then supplied to the ground return line by a Y-capacitor C16 between the output OUT of the amplifier 10 and ground. The canceling current is injected by this capacitor C16, which differentiates the output voltage of the amplifier with respect to the current.

The error amplifier 10 has at least two inputs, non-inverting and inverting inputs (see below), and one output.

The non-inverting input #1, the node between the bases of Q11 and Q14, senses the noise voltage potential on the GROUND line via a Y-graded capacitor C17.

An inverting input, input #3, the node between the emitters of Q9 and Q18, also senses the noise voltage potential on the GROUND line. This inverting input is connected to ground via a Y-graded capacitor C18.

An output OUT of the amplifier is connected to ground via the Y-graded capacitor C16 and leads the canceling current from the output OUT to ground, and also feeds back the output OUT to the inverting input #2, which in this embodiment is the same node as input #3, namely the node between the emitters of Q9 and Q18.

In order to avoid unintentional instability of the amplifier induced by the line impedance and to absorb a large amplitude of 60 Hz common mode voltage, there are several important considerations when doing active cancellation, for which this proposed topology features the following internal structures:

To get high input impedance, the amplifier 10 has a high impedance voltage input #1, which is the node of the bases of Q11 and Q14. High input impedance is important in order to be able to use a small capacitance for C17. This is important for common mode cancellation because it limits the total Y capacitance value needed.

To maintain the output voltage at the middle of the supply rail, the amplifier has a second input #2 that has low input impedance and receives the error signal from the output OUT in current form. The second input is the node of the emitters of Q9 and Q18. This middle point voltage maintenance is important so that the output stage of the amplifier may have maximum headroom for the next current injection.

To obtain higher frequency response and to avoid a gain-bandwidth tradeoff and slew rate limiting, the amplifier has a third input #3 that has low impedance and inputs the error signal in current form from the ground line via Y-capacitor C18 and terminal CFB. To avoid the drawbacks of the current input structure, this third input is effective mainly in the higher frequency range. The third input, like the second input in this embodiment, is the node between the emitters of Q9 and Q18. This function is effective for improving bandwidth; however, if desired, the amplifier could serve its purpose without this input.

The amplifier has a main gain stage of a transresistance amplifier 40 followed by a buffer amplifier 50 which reinforces output current capacity. The transresistance amplifier 40 includes a current mirror circuit, Q1, Q2, Q3, Q23, Q24, Q25, and resistors R36 and R37. The buffer amplifier 50 includes Q7, Q19, Q8, and Q16 in FIGS. 1A and 1B.

Bus voltage for the amplifier 10 is provided from the LIVE line via a terminal VBUS.

In order to avoid the influence of a large 60 Hz common mode voltage signal, the amplifier has a high pass filter function 30 in the front end of the first voltage input. This filter comprises C17, R29, C12, and R30 in FIGS. 1A and 1B. This function enables the amplifier to detect and cancel several 10's of mV of high frequency noise, as compared to hundreds of volts of 60 Hz.

An RF receiver 20 or any equivalent device can be provided for sensing common mode noise and/or to test the operation of the disclosed circuit.

Other aspects of the circuit of FIGS. 1A and 1B including the active filter are described in Ser. No. 10/860,755 filed Jun. 2, 2004 (IR-2483), incorporated by reference.

SUMMARY OF THE INVENTION

The present invention improves upon prior circuits by providing a high-voltage linear amplifier IC with reduced power dissipation, faster operation, and small die size.

According to various aspects of the invention, an integrated high-voltage driver may comprise a low side well and a high side well; an error amplifier in the low side well for receiving a noise signal derived from an output drive signal of the driver, and operable to output a voltage mode error signal based on the noise signal; a level shifting circuit in the low side well for receiving a current input signal derived from the voltage mode error signal and outputting a current mode error signal to the high side well; and a drive circuit in the high side well which outputs the output drive signal for driving external power devices; wherein the current mode error signal influences the output drive signal so as to decrease the noise signal.

An external voltage/current converter advantageously receives the voltage mode error signal and supplies the current input signal to the level shifting circuit. The voltage/current converter may comprise a resistor, and a capacitor may further be connected in series with the resistor.

The current mode error signal is preferably outputted from the low side well and received by the high side well in differential current mode form. The current mode error signal is preferably received by current mirror circuitry in the high side well. The current mirror circuitry advantageously outputs a sum current derived from the current mode error signal, and the drive circuit buffers that current for driving the external power devices.

Other features and advantages of the present invention will become apparent from the following description of an embodiment of the invention which refers to the accompanying drawings.

DETAILED DESCRIPTION OF AN EMBODIMENT OF THE INVENTION

Figure 1A:
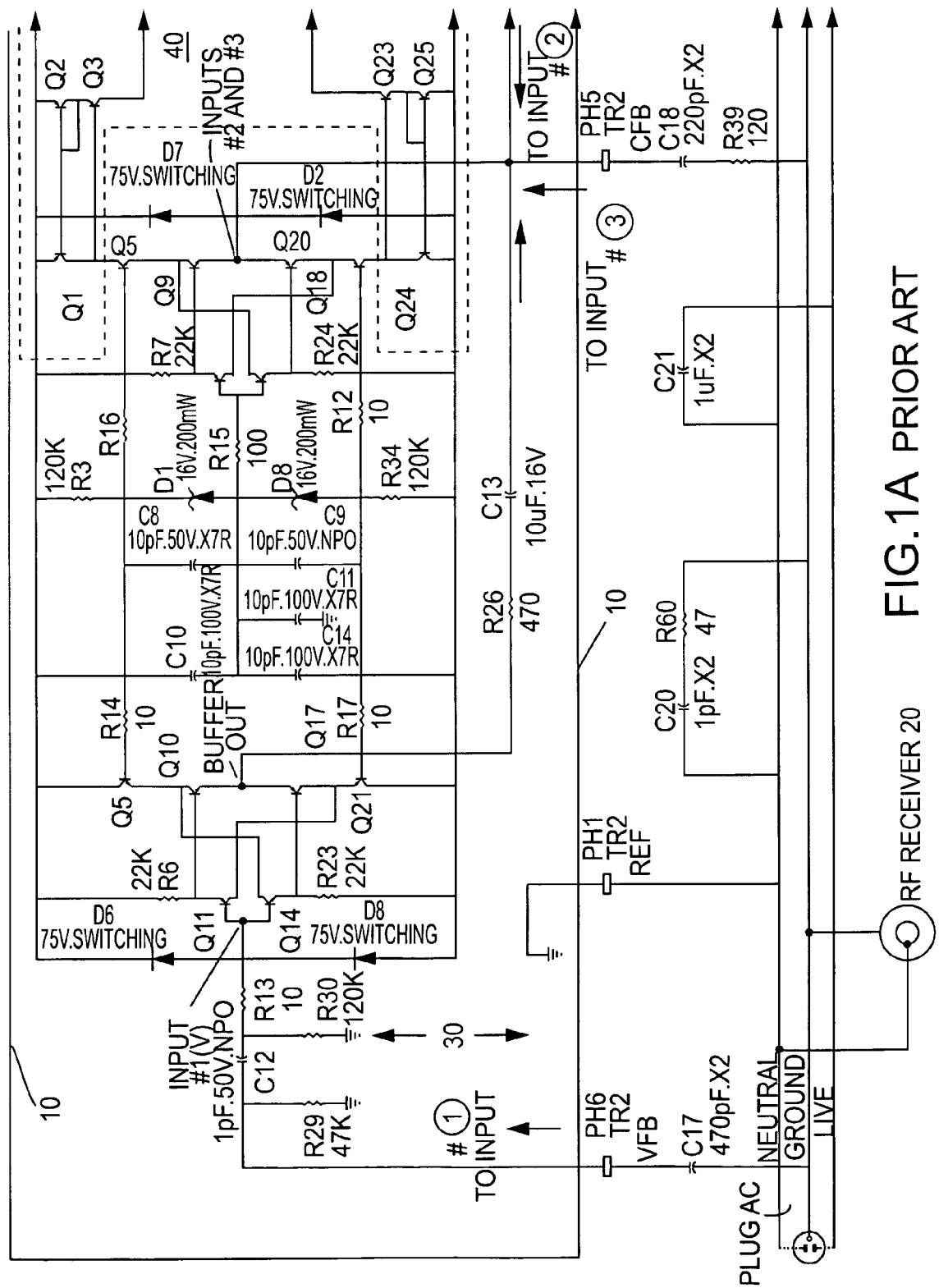
FIGS. 1A and 1B are a schematic diagram showing a discrete implementation of a high-voltage linear amplifier having a CT-less active filter for EMI reduction.
Figure 1B:
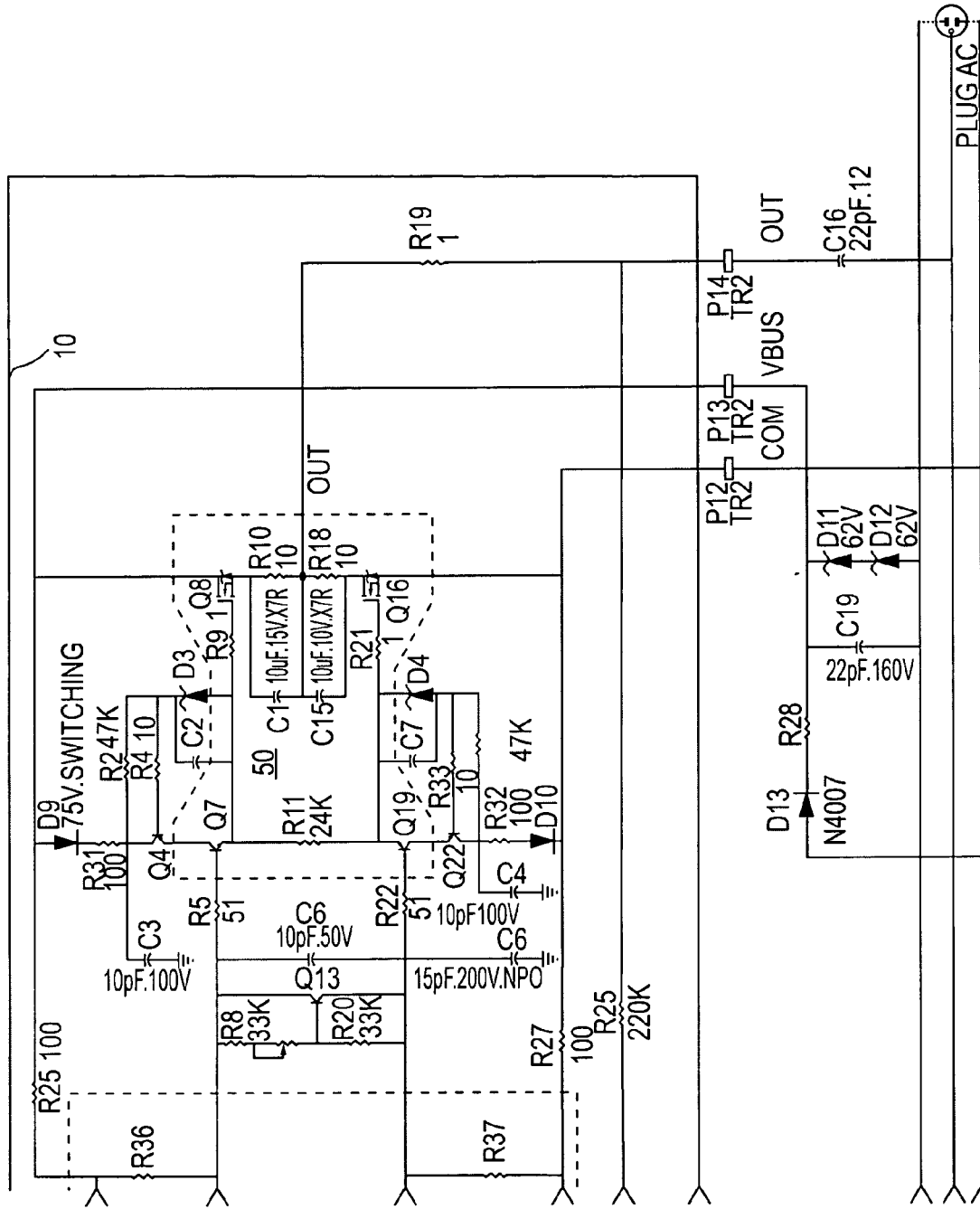
Figure 2:
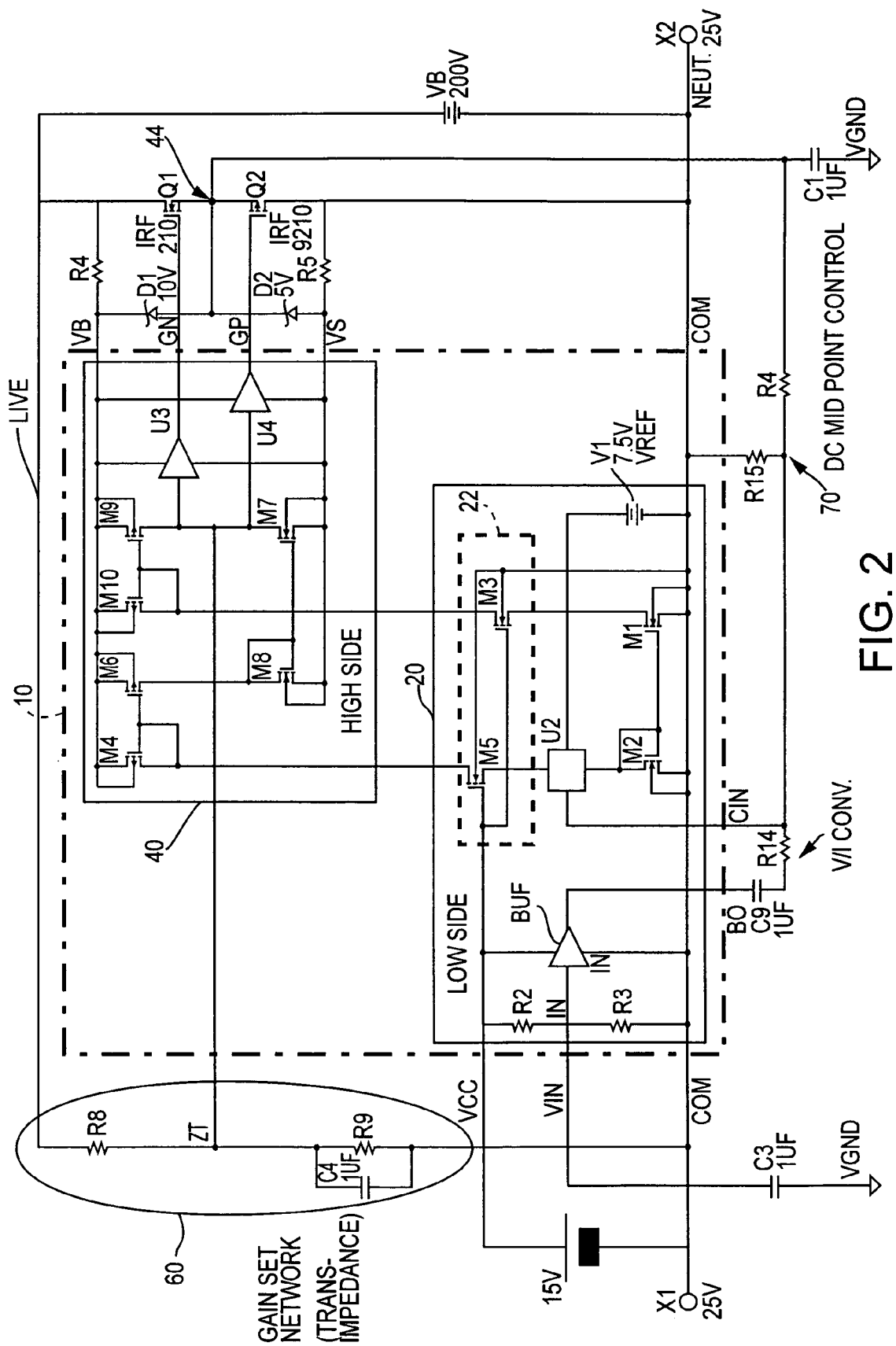
FIG. 2 is a simplified schematic diagram of a linear amplifier IC incorporating an active EMI filter according to an embodiment of the invention, in a gate-driver application.
Figure 3:
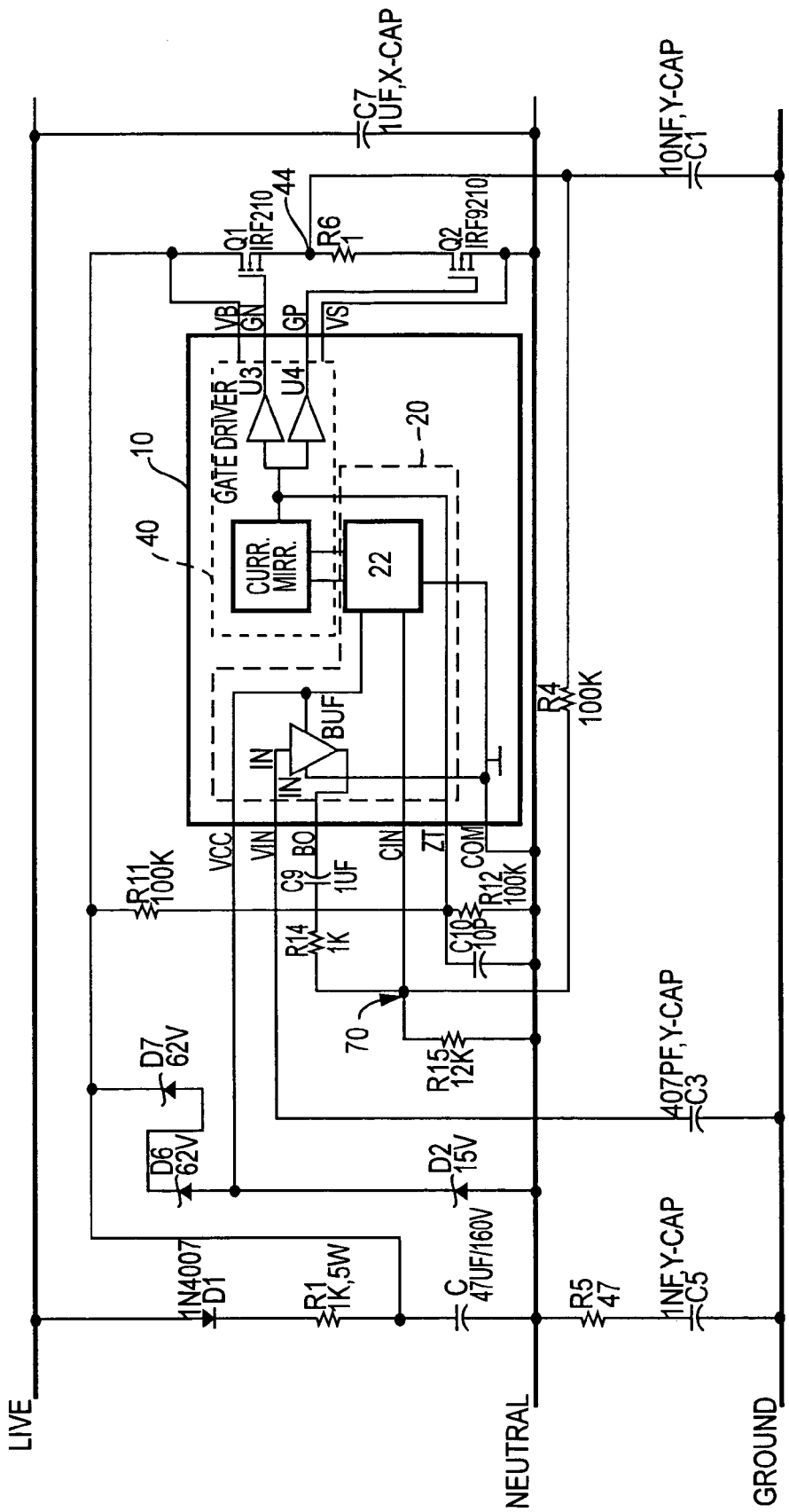
FIG. 3 is a simplified schematic diagram corresponding to the driver IC of FIG. 2, showing additional circuitry.

Referring to FIGS. 2 and 3, a high voltage linear amplifier IC 10 is split into two functional blocks corresponding to a low side well 20 and a high side well 40. The low side and high side are both built with a low voltage process, e.g. for operation at 15V–20V. The high side floats by means of isolation inside the IC 10.

A buffer BUF in the low side well 20 buffers the input noise voltage defined between VIN and COM. The loop gain of the system is determined in part by external capacitor C9 and resistor R14. The resistor 14 converts the noise information from voltage to current form.

In order to connect the two split portions of the circuit, a differential level shifter 22 FIG. 2) comprising MOSFETs M3, M5 is used. This level shifter can handle a high voltage difference, e.g. the 200V bus voltage VB (FIG. 2). Thus the amplifier 10 can have this full voltage swing between 200V and COM at its output at node 44, which is defined at the common source connection of the complementary external MOSFETs Q1, Q2.

The 15V power supply VCC of the low side portion 20 is also applied with respect to the neutral line COM.

The power supply VB of the high side portion 40 is applied from outside of the IC (see the 200V DC source VB in FIG. 2) and floats and is referenced to its output 44. Hence it is a bootstrapped power supply.

The low side 20 has a low impedance non-inverting input CIN that receives an error signal in current form from the buffer BUF via buffer output terminal BO and transfers the information to current mirror circuits M4, M6; M7, M8; and M9, M10 in the high side 40 in current mode. The voltage-to-current converter V/I shown in FIG. 2 corresponds to the capacitor C9 and resistor R14 shown in both FIG. 2 and FIG. 3. The error information is transferred in current mode due to the common-gate arrangement in the level shifter 22. Therefore, only the two transistors in the level shifter 22 are required to have high voltage (e.g., 200V) capability. All the other transistors can be made by a low voltage process for operation, e.g., at 20V.

The analog level shifter 22 receives a pair of differential current mode signals and transfers the error signal to the high side. This differential current mode signal transfer cancels out dynamic parasitic current components created by parasitic elements inside the IC.

The voltage at the current summing node ZT between the respective sources of M9 and M7 (FIG. 2) is buffered by linear circuits U3, U4 and outputted at GN, GP to drive the MOSFETS Q1, Q2.

The supply voltage VB of the high side circuit is bootstrapped with respect to its output voltage at 44 so that a low voltage process can be used inside the high side well 40. This bootstrapping makes the effective input impedance of the high side much higher, so as to greatly increase the open loop transconductance of the amplifier.

In order to provide closed-loop control for these two split circuits, and to set the operating bias at the output node, a dual loop feedback arrangement is used. One feedback loop comprising C1 and C3 feeds back an AC signal to VIN to determine the closed loop gain of the system via terminal VIN, while the other loop feeds back DC to a node 70 to set an operating point at the midpoint of the output voltage at 44.

The gain set network 60 (FIG. 2) sets the open loop gain and provides a DC bias point midway between VB and COM, that is, R8=R9. More specifically, the gain is based on the total impedance of the network 60, divided by the total impedance of C9 and R14.

With the circuit presented, a high voltage, high-speed amplifier can be configured by adding two external complementary MOSFETs Q1, Q2.

According to this circuit arrangement, an expensive prior art high voltage process that enables full high voltage swing is unnecessary. This leads to three major advantages:

1. Lower power dissipation. Power dissipation is proportional to the square of the applied supply voltage.

2. Can be implemented into a smaller die size. High voltage components require much more area than low voltage ones.

3. Operation can be faster. Smaller geometry has less parasitic components that slow down the speed.

Although the present invention has been described in relation to particular embodiments thereof, many other variations and modifications and other uses will become apparent to those skilled in the art. Therefore, the present invention is not limited by the specific disclosure herein.

What is claimed is:

1. An integrated high-voltage driver, comprising:
a low side well and a high side well;
an error amplifier in said low side well for receiving a noise signal derived from output drive signals of said driver, and operable to output a voltage mode error signal based on said noise signal;

a level shifting circuit in said low side well for receiving a current input signal derived from said voltage mode error signal and outputting a current mode error signal to said high side well; and a drive circuit in said high side well which outputs said output drive signals for driving external power devices;

wherein the current mode error signal influences said output drive signals so as to decrease said noise signal.

2. In combination with the driver of claim 1, an external voltage-to-current converter which receives said voltage mode error signal and supplies said current input signal to said level shifting circuit.

3. The combination according to claim 2, wherein said voltage-to-current converter comprises a resistor.

4. The combination according to claim 3, wherein said voltage-to-current converter further comprises a capacitor connected in series with said resistor.

5. The driver according to claim 1, wherein said current mode error signal is outputted from said low side well and received by said high side well in differential current mode form.

6. The driver according to claim 5, wherein said current mode error signal is received by current mirror circuitry in said high side well.

7. The driver according to claim 6, wherein said current mirror circuitry outputs a sum current derived from said current mode error signal, and said drive circuit buffers said current for driving said external power devices.

* * * * *